US008343812B2

(12) United States Patent
Song et al.

(10) Patent No.: US 8,343,812 B2
(45) Date of Patent: Jan. 1, 2013

(54) CONTACT STRUCTURES IN SUBSTRATE HAVING BONDED INTERFACE, SEMICONDUCTOR DEVICE INCLUDING THE SAME, METHODS OF FABRICATING THE SAME

(75) Inventors: Min-Sung Song, Hwaseong-si (KR); Soon-Moon Jung, Seongnam-si (KR); Han-Soo Kim, Suwon-si (KR); Young-Seop Rah, Yongi-si (KR); Won-Seok Cho, Suwon-si (KR); Yang-Soo Son, Hwaseong-si (KR); Jong-Hyuk Kim, Osan-si (KR); Young-Chul Jang, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/204,385

(22) Filed: Aug. 5, 2011

(65) Prior Publication Data

US 2011/0287590 A1   Nov. 24, 2011

Related U.S. Application Data

(62) Division of application No. 12/504,989, filed on Jul. 17, 2009, now abandoned.

(30) Foreign Application Priority Data

Jul. 21, 2008   (KR) ........................ 10-2008-0070716

(51) Int. Cl.
*H01L 21/82* (2006.01)

(52) U.S. Cl. ........................................ 438/129; 438/201
(58) Field of Classification Search .......... 257/314–326, 257/E29.137, E29.129, E29.3; 438/129, 438/201, 211, 257
See application file for complete search history.

(56) References Cited

U.S. PATENT DOCUMENTS

| | | | |
|---|---|---|---|
| 5,573,961 A | 11/1996 | Hsu et al. | |
| 5,612,552 A * | 3/1997 | Owens | 257/202 |
| 6,943,067 B2 | 9/2005 | Greenlaw | |
| 2002/0119640 A1 | 8/2002 | Gonzalez | |
| 2005/0056869 A1 | 3/2005 | Ichige et al. | |
| 2007/0007532 A1 | 1/2007 | Kang et al. | |
| 2007/0165455 A1 | 7/2007 | Park et al. | |
| 2008/0087932 A1 | 4/2008 | Son et al. | |
| 2008/0142990 A1 | 6/2008 | Yu et al. | |

FOREIGN PATENT DOCUMENTS

| | | |
|---|---|---|
| JP | 2008-091693 A | 4/2008 |
| KR | 10-2005-0070527 A | 7/2005 |
| KR | 10-0655664 B1 | 12/2006 |
| KR | 10-0673019 B1 | 1/2007 |

* cited by examiner

*Primary Examiner* — Tucker Wright
(74) *Attorney, Agent, or Firm* — Muir Patent Consulting, PLLC

(57) ABSTRACT

On embodiment of a contact structure may include a lower insulation layer on a lower substrate, an upper substrate on the lower insulation layer, a groove penetrating the upper substrate to extend into the lower insulation layer, the groove below an interface between the upper substrate and the lower insulation layer, an upper insulation layer in the groove, and a contact plug penetrating the upper insulation layer in the groove to extend into the lower insulation layer.

9 Claims, 22 Drawing Sheets

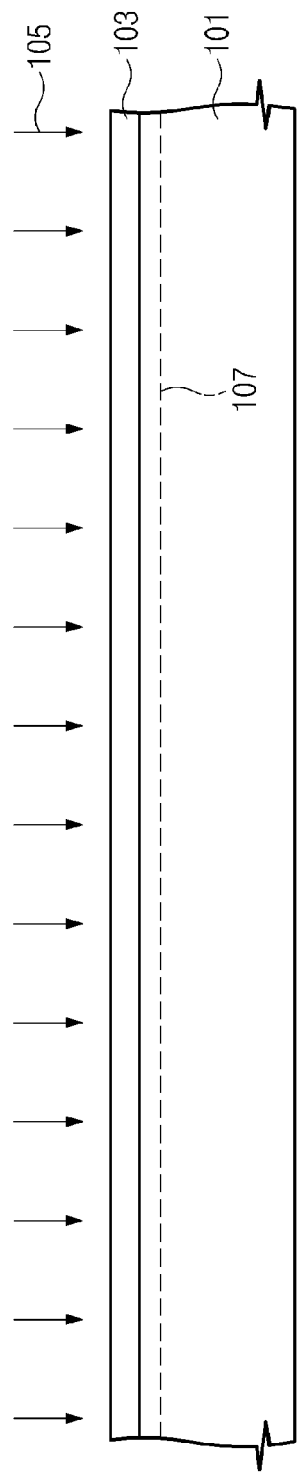
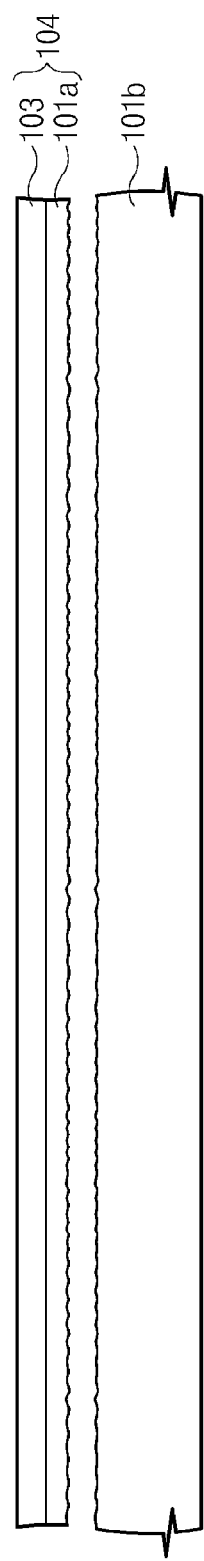

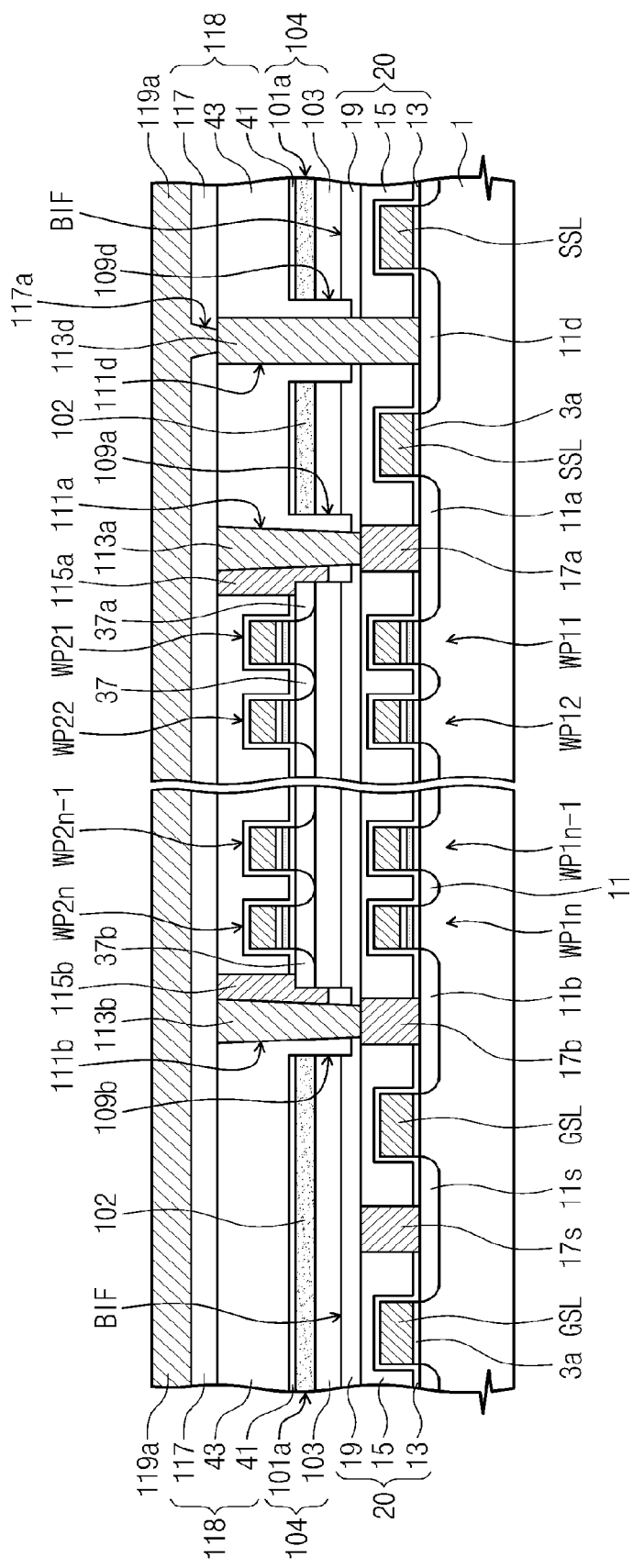

CONTACT STRUCTURES IN SUBSTRATE HAVING BONDED INTERFACE, SEMICONDUCTOR DEVICE INCLUDING THE SAME, METHODS OF FABRICATING THE SAME

CROSS-REFERENCE TO RELATED APPLICATIONS

This U.S. non-provisional patent application is a divisional of and claims priority under 35 U.S.C. §120 to U.S. patent application Ser. No. 12/504,989, which claims priority under 35 U.S.C. §119 of Korean Patent Application No. 10-2008-0070716, filed on Jul. 21, 2008, the entire contents of each of these applications being hereby incorporated by reference.

BACKGROUND

The present general inventive concept relates to a semiconductor device and a method of fabricating the same.

A semiconductor device may include an integrated circuit having a specific function and the integrated circuit may include a plurality of discrete devices within a limited area of a semiconductor substrate. The discrete devices include active devices such as transistors and passive devices such as capacitors.

A semiconductor device having a three-dimensional structure may increase the degree of integration in the semiconductor device. The three-dimensional semiconductor device may include a plurality of stacked semiconductor substrates, and integrated circuits having specific functions are disposed on the respective semiconductor substrates. For example, the three-dimensional semiconductor device may include a first substrate, a second substrate attached on the first substrate, and first and second integrated circuits formed on the first and second substrates, respectively. In this example, to electrically attach the first integrated circuit to the second integrated circuit, contact plugs may be formed between the first and second substrates (e.g., to penetrate an interface therebetween).

SUMMARY

The present general inventive concept may provide a semiconductor device and a method of fabricating the same.

The present general inventive concept may provide contact structures and methods suitable to electrically couple respectively different stacked semiconductor substrates and semiconductor devices including the same.

The present general inventive concept may provide contact structures and methods thereof suitable to reduce electrical shorts between contact plugs penetrating an interface between respectively different stacked substrates and semiconductor devices including the same.

The present general inventive concept may provide methods of fabricating a contact structure electrically connecting respectively different stacked substrates and semiconductor substrates including the same.

Additional aspects and/or utilities of the present general inventive concept will be set forth in part in the description which follows and, in part, will be obvious from the description, or may be learned by practice of the present general inventive concept.

The foregoing and/or other aspects and utilities of the present general inventive concept may be achieved by providing contact structures that can include a lower insulation layer on a lower substrate, an upper substrate on the lower insulation layer, a groove from the upper substrate to extend into the lower insulation layer, the groove to have a bottom surface lower than an interface between the upper substrate and the lower insulation layer, an upper insulation layer to cover the groove, and a contact plug from the upper insulation layer in the groove to extend into the lower insulation layer.

The foregoing and/or other aspects and utilities of the present general inventive concept may be achieved by providing methods of fabricating a contact structure that can include forming a lower insulation layer on a lower substrate, disposing an upper substrate on the lower insulation layer, forming a groove penetrating the upper substrate and the lower insulation layer, forming an upper insulation layer over the groove, and forming a contact plug penetrating the lower insulation layer under the groove.

The foregoing and/or other aspects and utilities of the present general inventive concept may be achieved by providing semiconductor devices that can include a lower memory cell unit on a lower substrate, a lower insulation layer covering the lower substrate and the lower memory cell unit, an upper substrate on the lower insulation layer, an upper memory cell unit on the upper substrate, a bit line groove to penetrate through the upper substrate into the lower insulation layer, the bit line groove having a lower bottom surface lower than an interface between the upper substrate and the lower insulation layer, an upper insulation layer to fill the bit line groove and cover the upper substrate and the upper memory cell unit, and a bit line contact plug penetrating the upper insulation layer in the bit line groove to extend into the lower insulation layer, the bit line contact to electrically connect to the lower substrate.

The foregoing and/or other aspects and utilities of the present general inventive concept may be achieved by providing methods of fabricating a semiconductor device that can include forming a lower memory cell unit at a lower substrate, forming a lower insulation layer on the lower substrate and the lower memory cell unit, disposing an upper substrate on the lower insulation layer, forming an upper memory cell unit at the upper substrate, forming a bit line groove penetrating the upper substrate to extend into the lower insulation layer, the bit line groove having at least a part of a bottom surface lower than an interface between the upper substrate and the lower insulation layer, forming an upper insulation layer on the upper substrate and the upper memory cell unit, the upper insulation layer in the bit line groove, and forming a bit line contact plug at the bit line groove to extend into the lower insulation layer and electrically connect to the lower substrate.

The foregoing and/or other aspects and utilities of the present general inventive concept may be achieved by providing a contact structure that may include a first insulation layer on at least a portion of a first substrate, a second substrate coupled to the first insulation layer, a recess in the second substrate to have a portion thereof below an interface between the second substrate and the first insulation layer, a second layer to cover the interface in the recess, and a conductor to contact the lower insulation layer via the recess.

The foregoing and/or other aspects and utilities of the present general inventive concept may be achieved by providing a method of fabricating a semiconductor device that can include forming a lower insulation layer on a lower substrate, disposing an upper substrate at the lower insulation layer, forming a groove penetrating the upper substrate and into the lower insulation layer, the groove having a bottom surface that is lower than an interface between the upper substrate and the lower insulation layer, forming a contact device in at least a portion of the groove extending over the lower insulation layer and forming an upper insulation layer to cover the interface exposed in the groove.

The foregoing and/or other aspects and utilities of the present general inventive concept may be achieved by providing memory system that may include a multi-level memory device, and a controller to control the memory device, the memory device that may include a lower substrate comprising a lower memory cell unit, a lower insulation layer over portions of the lower memory cell unit, an upper substrate to bond to the lower insulation layer, the upper substrate comprising an upper memory cell unit, a groove to extend from the upper substrate into the lower insulation layer below an interface between the upper substrate and the lower insulation layer, and a first contact plug in the groove spaced apart from the interface in the groove to contact the lower insulation layer, the first contact plug being electrically connected to the lower substrate, the first contact plug physically separated from the interface.

BRIEF DESCRIPTION OF THE FIGURES

Example embodiments will be more clearly understood from the following detailed description taken in conjunction with the accompanying drawings. FIGS. 1-20B represent non-limiting exemplary embodiments as described herein:

FIGS. 1 through 8 are diagrams that illustrate cross-sectional views illustrating a method of fabricating a contact structure according to example embodiments;

FIG. 9 is an circuit diagram that illustrates a portion of a semiconductor device according to another example embodiment;

FIG. 10 is a plan view corresponding to a circuit diagram of FIG. 9;

FIGS. 11A, 12A and 15A through 20A illustrate sectional views corresponding to line I-I' of FIG. 10; and FIGS. 11B, 12B and 15B through 20B illustrate sectional views corresponding to line II-II' of FIG. 10.

FIGS. 13 and 14 are figures that illustrate sectional views generic to lines I-I' and II-II' of FIG. 10.

DETAILED DESCRIPTION OF EMBODIMENTS

Figure 1:
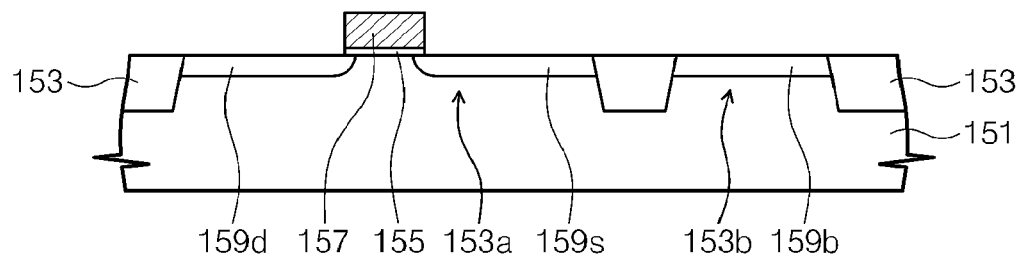

Example embodiments will be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. In the drawings, the thickness of layers, films and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and are not intended to illustrate the actual shape or doping concentration of a region of a device and are not intended to limit the scope of example embodiments.

FIGS. 1 through 8 are diagrams that illustrate cross-sectional views of methods of fabricating a contact structure according to example embodiments.

As shown in FIG. 1, a device isolation layer 153 may be provided in a first substrate 151 e.g., a prescribed area of a lower substrate, to define first and second active regions 153a and 153b. The lower substrate 151 may be a first impurity type or first conductivity type semiconductor substrate. For example, the lower substrate 151 may be a P-type silicon substrate.

A gate insulation layer 155 may be formed on the active regions 153a and 153b, and a gate conductive layer may be formed on the gate insulation layer 155 or on an entire surface of a substrate having the gate insulation layer 155. The gate conductive layer may be patterned to form a gate electrode 157 crossing over the top of the first active region 153a. An over-etch of the gate insulation layer 155 when patterning the gate conductive layer may expose an entire surface of the first and second active regions at both sides of the first gate electrode 157.

By using the gate electrode 157 and the device isolation layer 153 as ion implantation masks, second conductivity type impurity ions, e.g., N-type impurity ions, may be implanted in the first active region 153a to form a source region 159s and a drain region 159d. First conductivity type impurity ions may be implanted in the second active region 153b to form a pickup region 159b.

Figure 2:
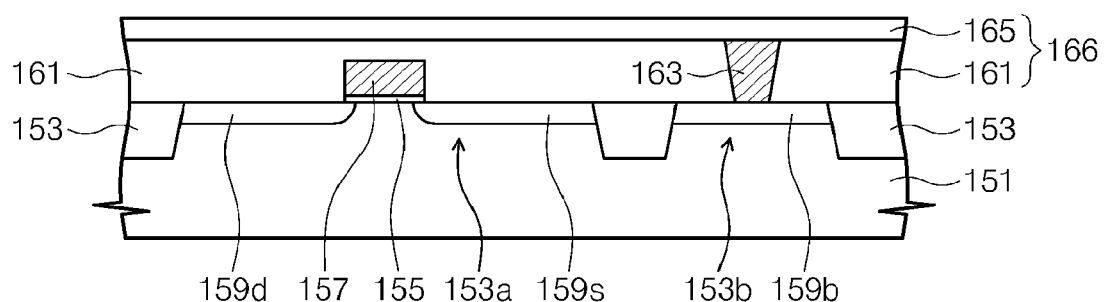

As shown in FIG. 2, a first lower insulation layer 161 may be formed on a surface of the substrate having the gate electrode 157, the source/drain regions 159s and 159d and the pickup region 159b. A conductive contact pad 163 to penetrate a first lower insulation layer 161 to contact the pickup region 159b may be formed. In exemplary embodiments, a second lower insulation layer 165 may be formed on the conductive contact pad 163 and the first lower insulation layer 161. The first and second lower insulation layers 161 and 165 may constitute a lower insulation layer 166.

In other exemplary embodiments, a process for forming the conductive contact pad 163 may be omitted and/or a process for forming the second lower insulation layer 165 may be omitted. In such exemplary embodiments, the lower insulation layer 166 may include only the first lower insulation layer 161.

Figure 3:
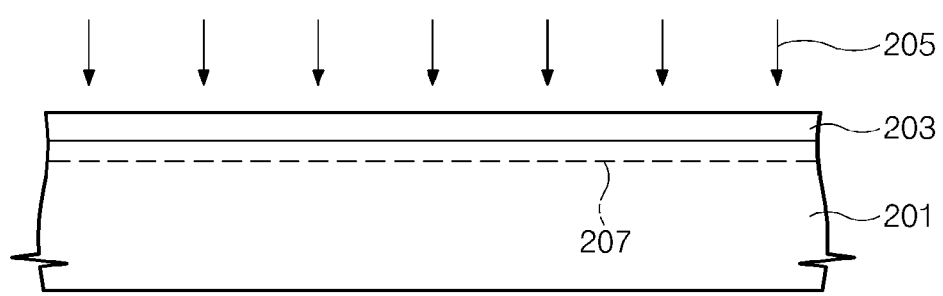
Figure 4:
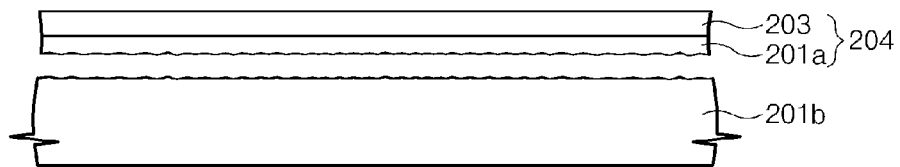

FIGS. 3 and 4 are cross-sectional views illustrating one exemplary method of fabricating a second substrate, e.g., an upper substrate according to example embodiments. However, example embodiments are not intended to be so limited as the upper substrate may be formed through various methods.

As shown in FIG. 3, a buffer layer 203 may be formed on a main surface of a handling substrate 201. The handling substrate 201 may be a semiconductor substrate. For example, the handling substrate 201 may be a silicon substrate or the like. Additionally, the buffer layer 203 may be an insulating buffer layer. For example, the buffer layer 203 may be formed of an insulation layer such as a silicon oxide layer. An impurity ion layer 207, e.g., a hydrogen ion layer, may be formed in the handling substrate 201 by implanting impurity ions 205 such as hydrogen ions in the upper portion of the handling substrate 201 below the buffer layer 203.

The buffer layer 203 may prevent or reduce ion implantation damage on the main surface of the handling substrate 201 while the impurity ions 205 are implanted. The impurity ion layer 207 may be formed with a prescribed depth from the main surface of the handling substrate 201. In one exemplary embodiment, a process for forming the buffer layer 203 may be omitted.

As shown in FIG. 4, a thermal treatment process may be performed on the handling substrate 201 having the impurity ion layer 205 to activate impurity ions (e.g., hydrogen ions) in the impurity ion layer 207. As a result, surface layer 201a between the main surface of the handling substrate 201 and the impurity ion layer 205 may be detached from a bulk layer 201b of the handling substrate 201 as illustrated in FIG. 4. For example, minute bubbles may be formed in the impurity ion layer 207 to detach the surface layer 201a. The surface layer 201a and the buffer layer 203 may constitute the second substrate 204, e.g., an upper substrate. The surface layer 201a may be a semiconductor layer such as a silicon layer. When a process to form the buffer layer 203 is omitted, the upper substrate 204 may include only the semiconductor layer 201a.

Since the semiconductor layer 201a is detached (e.g., by the bubbles generated because of impurity ion activation), a detached surface of the semiconductor layer 201a may be uneven as illustrated in FIG. 4. Accordingly, a polishing process may be applied on the detached surface of the semiconductor layer 201a to form a smooth surface or the semiconductor layer 201a having an even surface.

Figure 5:
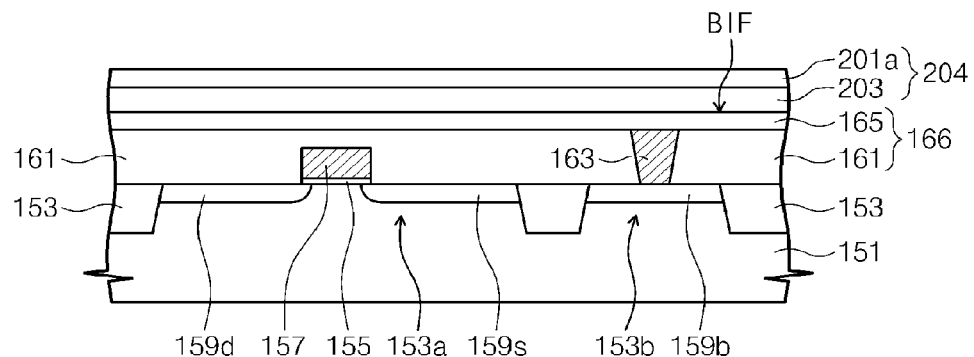

As shown in FIG. 5, the upper substrate 204 may be physically bonded onto the lower substrate 151. When the upper substrate 204 includes the semiconductor layer 201 a and the buffer layer 203, the lower insulation layer 166 may be bonded to the buffer layer 203. As described herein, since the upper substrate 204 is physically bonded onto the lower insulation layer 166, adhesion between the upper substrate 204 and the lower insulation layer 166 may become weak. For example, since a physical bonded interface (BIF) between the upper substrate 204 and the lower insulation layer 166 has weak adhesion, when the BIF is exposed to external stress or a chemical solution, the upper substrate 204 may be loosened or detached from the lower insulation layer 166.

In another exemplary embodiment of the example embodiments, a polishing process may be applied to the semiconductor layer 201a after the upper substrate 204 is bonded onto the lower insulation layer 166.

Figure 6:
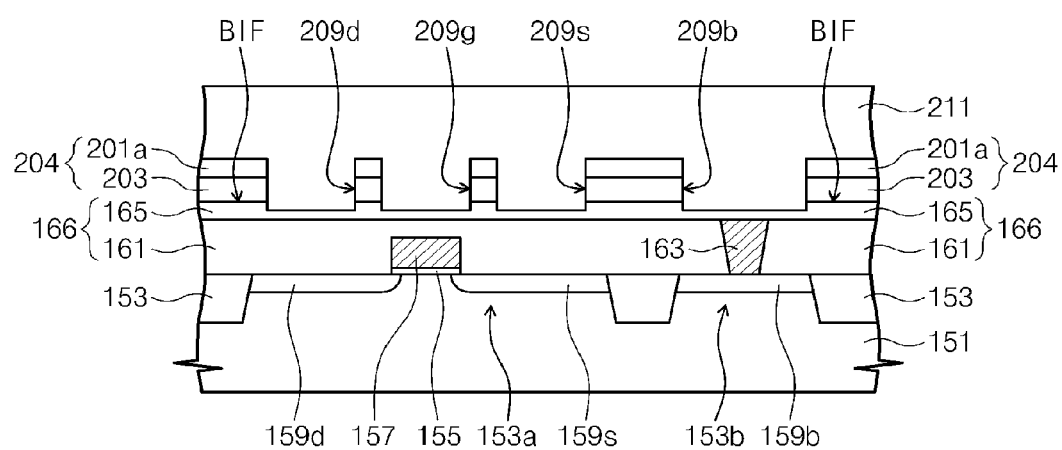

As shown in FIG. 6, a semiconductor integrated circuit (not shown) may be formed on the upper substrate 204, e.g., the semiconductor layer 201a. The upper substrate 204 and the lower insulation layer 166 are patterned (e.g., continuously) to form a plurality of grooves to penetrate the upper substrate 204 and extend into the lower insulation layer 166. The grooves may include but are not limited to drain grooves 209d, gate grooves 209g, source grooves 209s, and pickup grooves 209b, which are respectively formed on the drain region 159d, the gate electrode 157, the source region 159s, and the pickup region 159b.

The grooves 209d, 209g, 209s, and 209b may have bottom surfaces lower than the BIF as shown in FIG. 6. Accordingly, the grooves 209d, 209g, 209s, and 209b may include a portion such as sidewalls exposing the BIF. An upper insulation layer 211 may be formed on the upper substrate 204 to fill the grooves 209d, 209g, 209s, and 209b.

Figure 7:
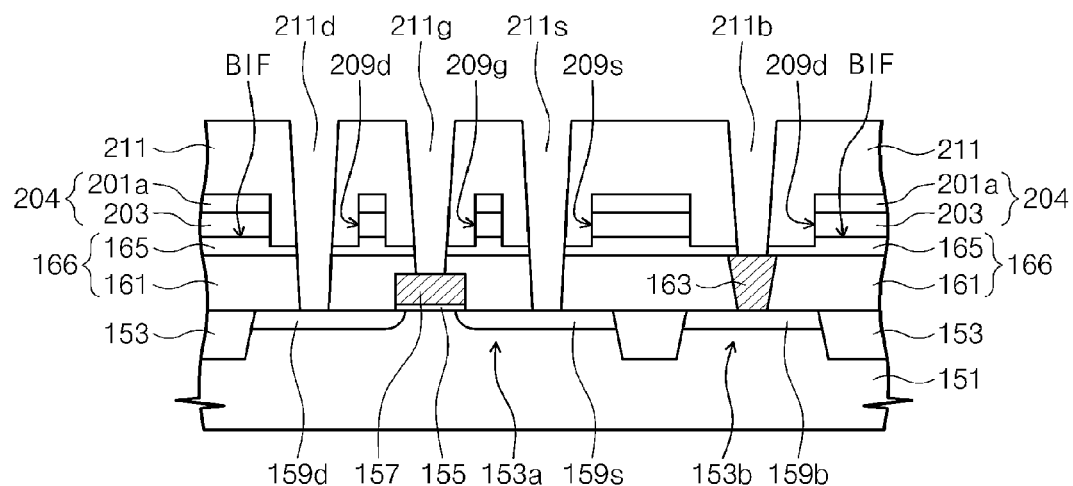

As shown in FIG. 7, the upper insulation layer 211 and the lower insulation layer 166 may be patterned to form a plurality of contact holes to penetrate the upper insulation layer 211 in the grooves 209d, 209g, 209s, and 209b and extend into the lower insulation layer 166. The contact holes may include a drain contact hole 211d, a gate contact hole 211g, a source contact hole 211s, and a pickup contact hole 211b, which respectively may expose the drain region 159d, the gate electrode 157, the source region 159s, and the conductive conduct pad 163. The contact holes 211d, 211g, 211s, and 211b may be formed spaced apart from the BIF exposed by the grooves 209d, 209g, 209s, and 209b. In some embodiments, after the contact holes 211d, 211g, 211s, and 211b are formed, the BIF may not be exposed. As a result, even when a wet process (e.g., a cleansing process) uses a chemical solution on the surface of the substrate having the contact holes e.g., contact holes 211d, 211g, 211s, and 211b), the upper substrate 204 may be prevented from being detached (e.g., partially) from the lower insulation layer 166 or have a decreased likelihood of being detached along the BIF.

Figure 8:
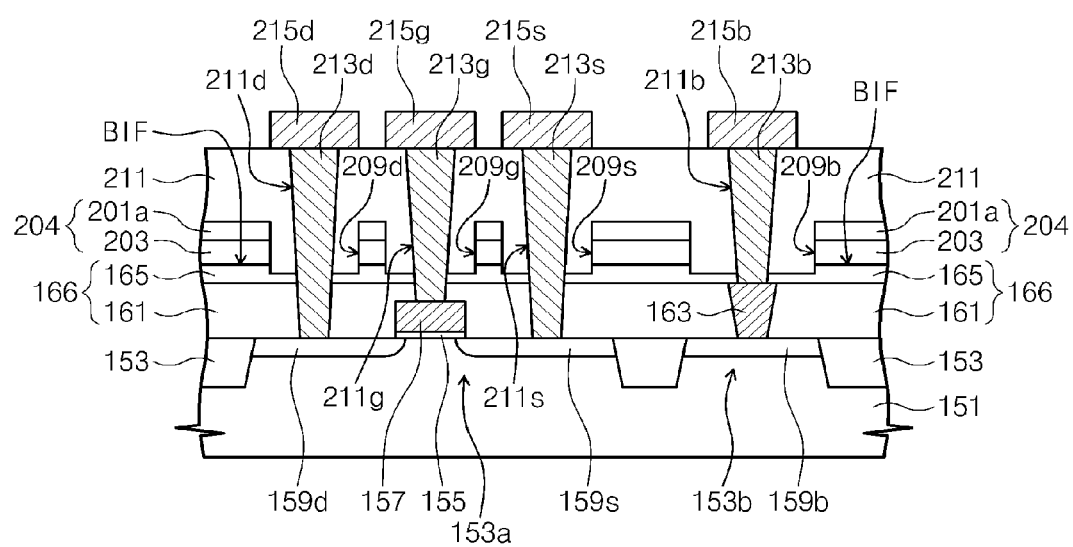

As shown in FIG. 8, contact plugs may be formed in the contact holes (e.g., contact holes 211d, 211g, 211s, and 211b). The contact plugs may include a drain contact plug 213d, a gate contact plug 213g, a source contact plug 213s and a pickup contact plug 213b, which respectively fill the drain contact hole 211d, the gate contact hole 211g, the source contact hole 211s and the pickup contact hole 211b. A plurality of wirings may be formed on the upper insulation layer 211. The wirings may include a drain wiring 215d, a gate wiring 215g, a source wiring 215s, and a pickup siring 215b, which can be respectively electrically connected to the drain contact plug 213d, the gate contact plug 213g, the source contact plug 213s, and the pickup contact plug 213b. Accordingly, the drain wiring 215d, the gate wiring 215g, the source wiring 215s and the pickup wiring 215b may be electrically connected to the drain region 159d, the gate electrode 157, the source region 159s, and the pickup region 159b, respectively, through the drain contact plug 213d, the gate contact plug 213g, the source contact plug 213s and the pickup contact plug 213b, respectively.

According to some example embodiments described herein, the BIF between the lower insulation layer 166 and the upper substrate 204 is not exposed through the contact holes 211d, 211g, 211s, and 211b. In one embodiment, the exposed BIF is covered. For example, the grooves 209d, 209g, 209s, and 209b having the bottom surfaces lower than the BIF may be filled with the upper insulation layer 211 and the contact holes 211d, 211g, 211s, and 211b penetrating the upper insulation layer 211 in the grooves 209d, 209g, 209s, and 209b may be spaced apart from the BIF. Accordingly, even when distances (e.g., intervals) between the contact holes 211d, 211g, 211s, and 211b are decreased, the contact plugs 213d, 213g, 213s, and 213b do not electrically contact each other.

Figure 9:
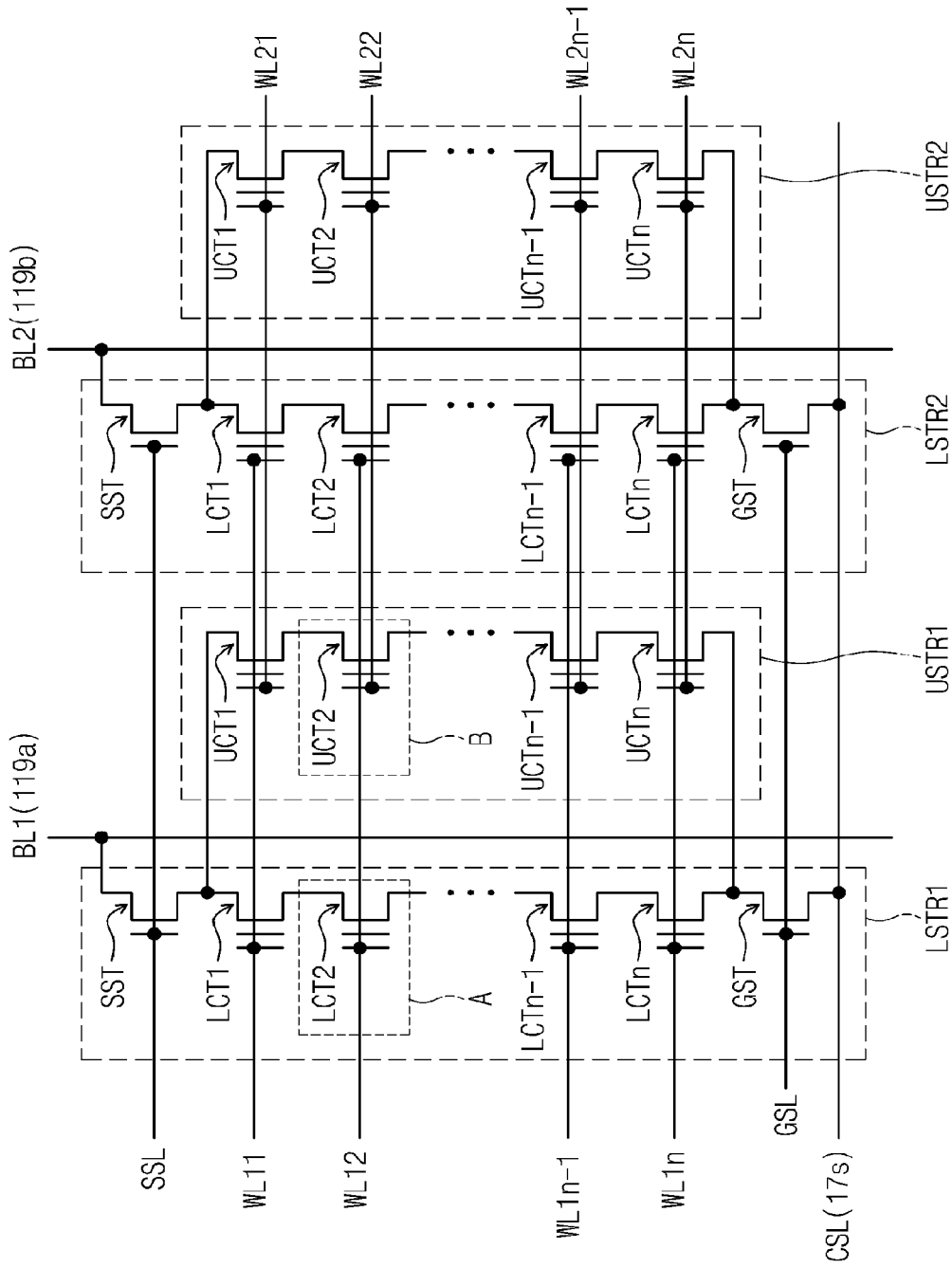

FIG. 9 is a circuit diagram illustrating a portion of a semiconductor device according to example embodiments. The equivalent circuit diagram of FIG. 9 illustrates a cell array region of a three-dimensional NAND flash memory device, however the example embodiments are not intended to be limited thereto. For example, the example embodiments can be applied to all three-dimensional semiconductor devices (e.g., three-dimensional memory devices or three-dimensional logic devices) having physically bonded respectively different substrates.

As shown in FIG. 9, the three-dimensional NAND flash memory device according to example embodiments can include first bit line BL1 or 119a and second bit line BL2 or 119b. However, example embodiments can be applied to other type stacked flash memory devices such as NOR flash memory devices. A first lower memory cell unit LSTR1 may be electrically connected to the first bit line 119a and a second lower memory cell unit LSTR2 may be electrically connected to the second bit line 119b. Each of the first and second lower memory cell units LSTR1 and LSTR2 may be a lower flash memory cell unit. However, the example embodiments are not intended to be limited to such an exemplary disclosure.

For example, the first lower memory cell unit LSTR1 may be a first lower NAND string including a string selection transistor SST, a plurality of lower cell transistors LCT1 to LCTn, and a ground selection transistor GST, which may be connected in series to the first bit line 119a. The second lower memory cell unit LSTR2 may be a second lower NAND string including a string selection transistor SST, a plurality of lower cell transistors LCT1 to LCTn, and a ground selection transistor GST, which are connected in series to the second bit line 119b.

Further, the three-dimensional NAND flash memory device may include a first upper memory cell unit USTR1 and a second upper memory cell unit USTR2. In this example, each of the first and second upper memory cell units USTR1 and USTR2 is an upper flash memory cell unit. For example, the first upper memory cell unit USTR1 may be a first upper NAND string including a plurality of upper cell transistors UCT1 to UCTn connected in series. The second upper memory cell unit USTR2 may be a second upper NAND string including a plurality of upper cell transistors UCT1 to UCTn connected in series.

One end of the first upper memory cell unit USTR1 may be electrically connected to a source/drain region between the string selection transistor SST and the first lower cell transistor LCT1 of the first lower memory cell unit LSTR1. The other end of the first upper memory cell unit USTR1 may be electrically connected to a source/drain region between the ground selection transistor GST and the $n^{th}$ lower cell transistors LCTn of the first lower memory cell unit LSTR1. One end of the second upper memory cell unit USTR2 may be electrically connected to a source/drain region between the string selection transistor SST and the first lower cell transistor LCT1 of the second lower memory cell unit LSTR2. The other end of the second upper memory cell unit USTR2 may be electrically connected to a source/drain region between the ground selection transistor GST and the $n^{th}$ lower cell transistors LCTn of the second lower memory cell unit LSTR2.

Gate electrodes of the string selection transistors SST of the first and second lower memory cell units LSTR1 and LSTR2 may be electrically connected to the string selection line SSL. Gate electrodes of the ground selection transistors GST of the first and second lower memory cell units LSTR1 and LSTR2 may be electrically connected to the ground selection line GSL.

Gate electrodes of the first lower cell transistors LCT1 may be electrically connected to the first lower word line WL11, and gate electrodes of the second lower cell transistors LCT2 may be electrically connected to the second lower word line WL12. Gate electrodes of the n-$1^{th}$ lower cell transistors LCTn-1 may be electrically connected to the n-$1^{th}$ lower word line WL1n-1 and gate electrodes of the $n^{th}$ lower cell transistors LCTn may be electrically connected to the $n^{th}$ lower word line WL1n.

Gate electrodes of the first upper cell transistors UCT1 may be electrically connected to the first upper word line WL21, and gate electrodes of the second upper cell transistors UCT2 may be electrically connected to the second upper word line WL22. Gate electrodes of the n-$1^{th}$ upper cell transistors UCTn-1 may be electrically connected to the n-$1^{th}$ upper word line WL2n-1 and gate electrodes of the $n^{th}$ upper cell transistors UCTn may be electrically connected to the $n^{th}$ upper word line WL2n. Source regions of the ground selection transistors GST may be electrically connected to the common source line CSL or 17s.

As shown in FIG. 9, to selectively program a second upper cell transistor UCT2 (e.g., a cell transistor indicated with B) of the first upper memory cell unit USTR1, a supply voltage Vcc is applied to the string selection line SSL and the second bit line 119b (or, a non-selected bit line), and about 0 V is applied to the first bit line 119a (or, a selected bit line), the ground selection line GSL, and the common source line CSL. In one embodiment, a program voltage of about 20 V may be applied to the second upper word line WL22 connected to the selected cell transistor B, and a pass voltage Vpass of about 10 V may be applied to the remaining word lines WL21 to WL2n except for WL22.

In FIG. 9, erase operations of the memory cell units LSTR1, USTR1, LSTR2, and USTR2 may be performed by a block unit. For example, the erase operation may allow the common source line CSL and the bit lines BL1 and BL2 to float. This may be performed by applying about 0 V to the word lines WL11 to WL1n and WL21 to WL2n (e.g., all word lines) and applying an erase voltage of about 20 V to a semiconductor substrate (not shown) having the memory cell units LSTR1, USTR1, LSTR2, and USTR2.

As shown in FIG. 9, to selectively read data stored in the second lower cell transistor LCT2 (e.g., a cell transistor indicated with A) of the first lower memory cell unit LSTR1, a read voltage may be applied to the second lower word line WL12 connected to the selected cell transistor A and a read pass voltage may be applied to the remaining word lines WL11 to WL1n except for WL12. The read voltage may be lower than a threshold voltage of the programmed cell transistor and higher than a threshold voltage of the erased cell transistor. The read pass voltage may be higher than a threshold voltage of the programmed cell transistor.

While the read voltage and the read pass voltage are applied, a prescribed voltage (e.g., a ground voltage or a negative voltage) may be applied to the upper word lines WL21 to WL2n to turn off the upper cell transistors UCT1 to UCTn (e.g., all upper cell transistors). Further, a positive voltage may be applied to the first bit line 119a (e.g., a selected bit line) connected to the selected cell transistor A, and a ground voltage may be applied to the second bit line 119b (or, a non-selected bit line) and the common source line CSL.

Figure 10:
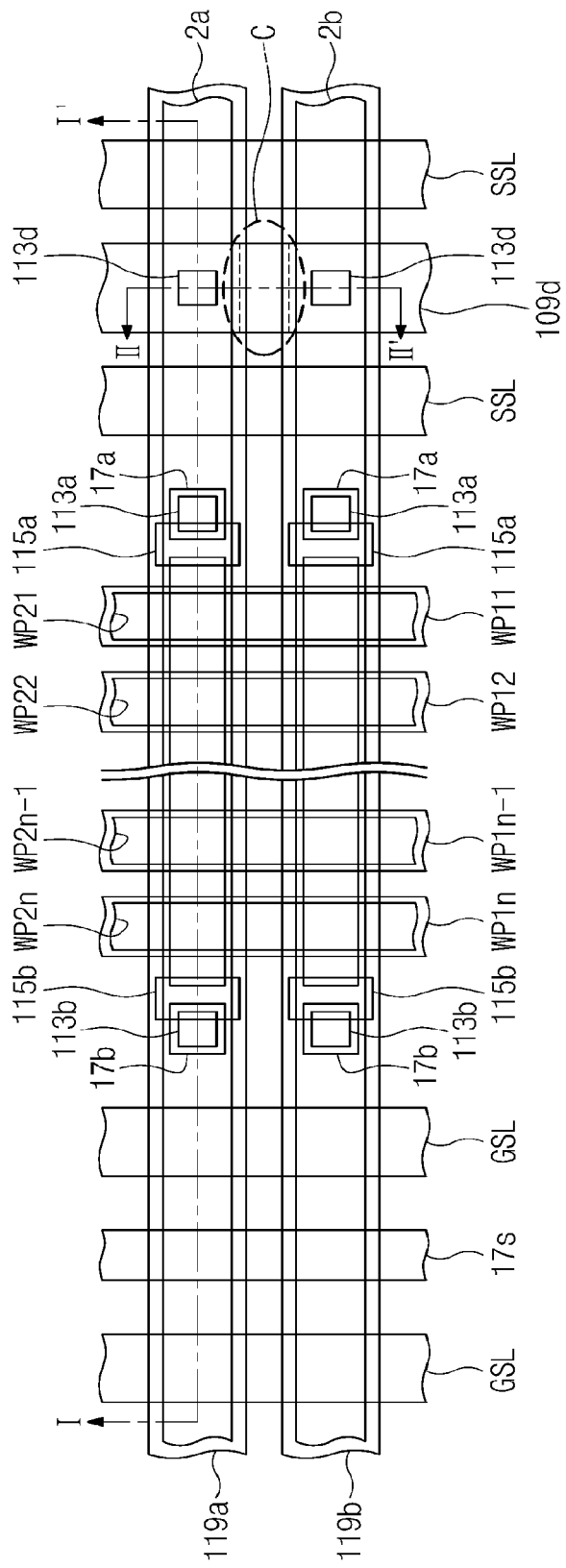

Methods of fabricating a three-dimensional semiconductor device according to example embodiments will now be described. One exemplary method may be applied to and will be described using a circuit shown in FIG. 9, however, examples embodiment are not intended to be limited to such disclosure. FIG. 10 is a plan view of a three-dimensional semiconductor device corresponding to the circuit diagram of FIG. 9. FIGS. 11A through 20A show sectional views taken along a line I-I' of FIG. 10, and FIGS. 11B through 20B show sectional views taken along a line II-II' of FIG. 10.

Figure 11A:
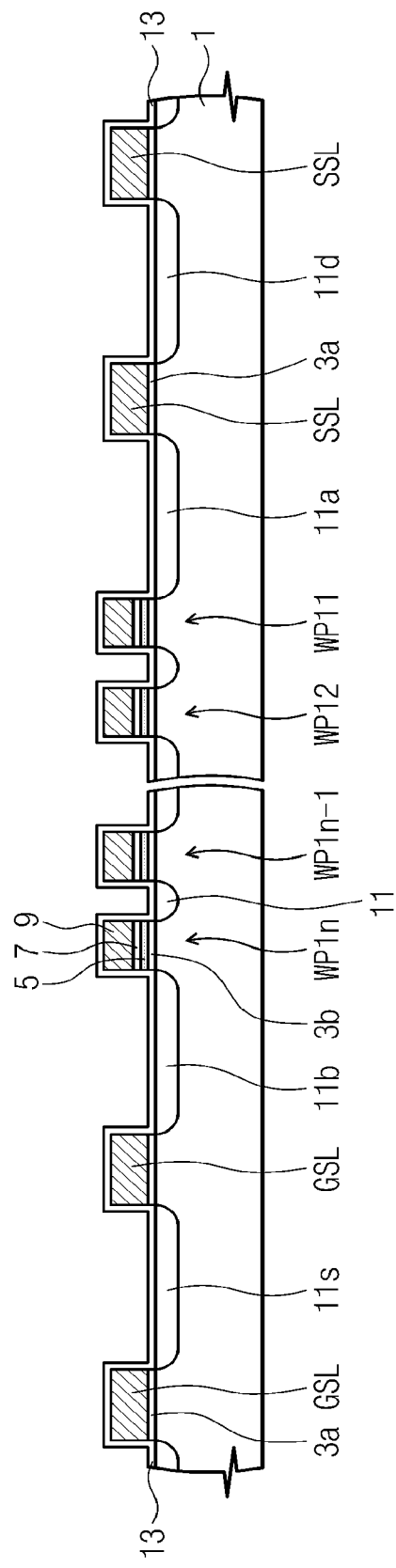
Figure 11B:
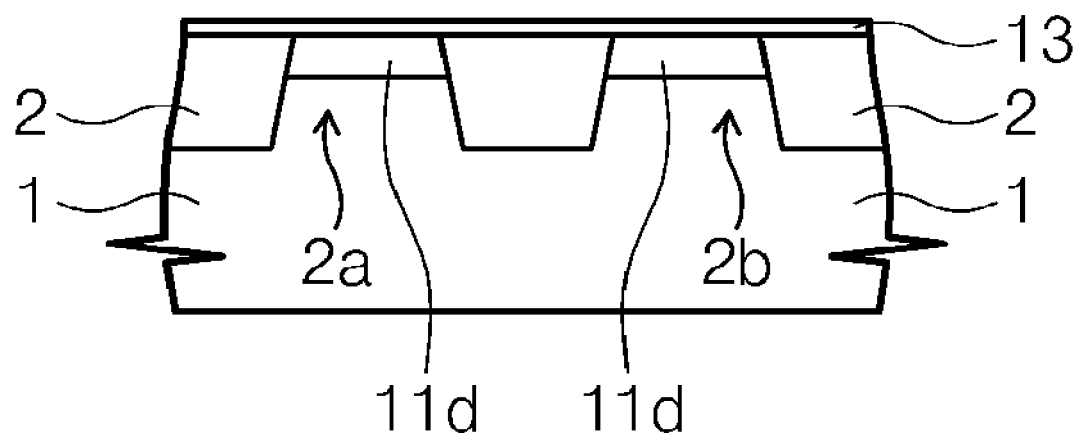

As shown in FIG. 10, FIG. 11A, and FIG. 11B, a lower device isolation layer 2 may be formed in a first substrate 1, e.g., a lower substrate, to define first and second lower active regions 2a and 2b. The lower substrate 1 may be a first conductivity type semiconductor substrate such as a P-type silicon substrate, and the first and second lower active regions 2a and 2b may be parallel to each other. A first selection line or ground selection line GSL, a second selection line or string selection line SSL, and a plurality of lower word line patterns WP11 to WP1n may be formed to cross over the top of the lower active regions 2a and 2b. The plurality of lower word line patterns WP11 to WP1n may be formed between the ground selection line GSL and the string selection line SSL.

A gate insulation layer 3a may be formed between the ground selection line GSL and the lower active regions 2a and 2b. The gate insulation layer 3a may be formed between the string selection line SSL and the lower active regions 2a and 2b. Each of the lower word line patterns WP11 to WP1n may include a tunnel insulation layer 3b, a charge storage layer 5, a blocking insulation layer 7, and a control gate electrode 9. The tunnel insulation layer 3b, the charge storage layer 5, the blocking insulation layer 7, and the control gate electrode 9 may be sequentially stacked. The control gate electrode 9 of the first lower word line pattern WP11 may correspond to the first lower word line WL11 of FIG. 9.The control gate electrode 9 of the $n^{th}$ lower word line pattern WP1n may correspond to the $n^{th}$ lower word line WL1n of FIG. 9.

According to example embodiments, the charge storage layer 5 may be formed of a conductive layer or an insulation layer. When the charge storage layer 5 is formed of the conductive layer, the charge storage layer 5 may serve as a floating gate. Alternatively, when the charge storage layer 5 is formed of the insulation layer, the charge storage layer 5 may serve as a charge trap layer.

By using the lower word line patterns WP11 to WP1n and the selection lines SSL and GSL as ion implantation masks, second conductivity type impurity ions, e.g., N-type impurity ions, may be implanted into the lower active regions 2a and 2b to form lower impurity regions. The lower impurity regions may include a string source region 11s, a string drain region 11d, a first lower node region 11a, a second lower node region 11b, and a plurality of lower cell source/drain regions 11. The string source region 11s may be formed in the lower active regions 2a and 2b adjacent to the ground selection line GSL and opposite to the lower word line patterns WP11 to WP1n. The string drain region 11d may be formed in the lower active regions 2a and 2b adjacent to the string selection line SSL and opposite to the to the lower word line patterns WP11 to WP1n. The first lower node region 11a may be formed in the lower active regions 2a and 2b between the string selection line SSL and the first lower word line pattern WP11 adjacent thereto. The second lower node region 11b may be formed in the lower active regions 2a and 2b between the ground selection line GSL and the $n^{th}$ lower word line pattern WP1n adjacent thereto. A plurality of lower cell source/drain regions 11 may be formed in the lower active regions 2a and 2b between the lower word line patterns WP11 to WP1n.

In this exemplary manner, ground selection transistors GST of FIG. 9 may be formed on intersections of the ground selection line GSL and the lower active regions 2a and 2b, and string selection transistors SST of FIG. 9 may be formed on intersections of the string selection line SSL and the lower active regions 2a and 2b. In addition, the first to $n^{th}$ lower cell transistors LCT1 to LCTn of FIG. 9 may be respectively formed on intersections of the lower word line patterns WP11 to WP1n and the first lower active region 2a. Similarly, the first to $n^{th}$ lower cell transistors LCT1 to LCTn of FIG. 9 may be respectively formed on intersections of the lower word line patterns WP11 to WP1n and the second lower active region 2b.

The string selection transistor SST, the lower cell transistors LCT1 to LCTn, and the ground selection transistor GST on the first lower active region 2a may be connected in series to constitute the first lower memory cell unit LSTR1, e.g., a first lower NAND string.The string selection transistor SST, the lower cell transistors LCT1 to LCTn, and the ground selection transistor GST on the second lower active region 2b may be connected in series to constitute the second lower memory cell unit LSTR2, e.g., a second lower NAND string.

A lower etching stop layer 13 may be formed at a surface of the substrate including the first and second lower memory cell units LSTR1 and LSTR2. The lower etching stop layer 13 may be formed of layer having an etch selectivity with respect to a silicon oxide layer. The lower etching stop layer may be an insulation layer. For example, the lower etching stop layer 13 may be formed of a silicon nitride layer.

Figure 12A:
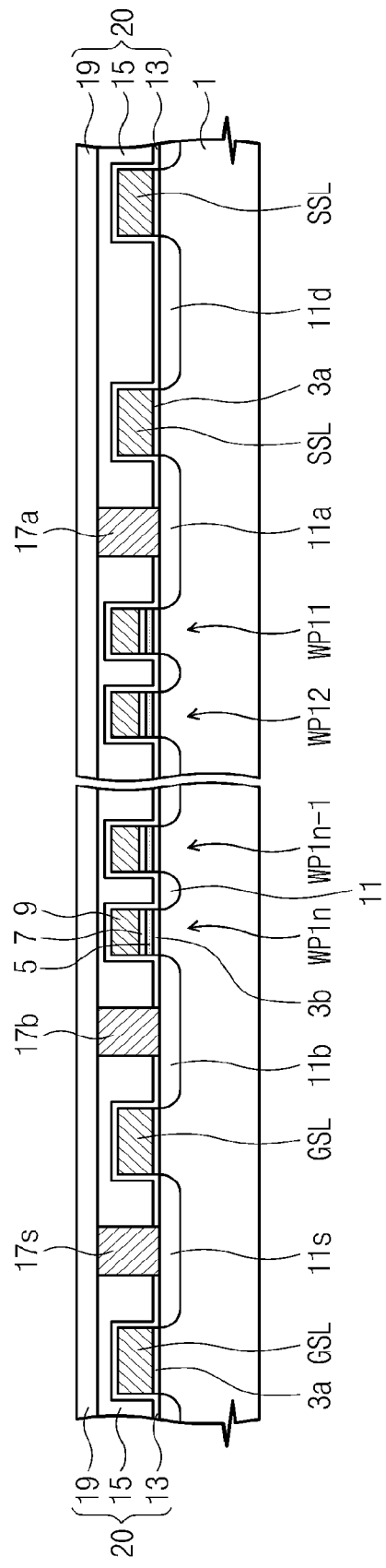
Figure 12B:
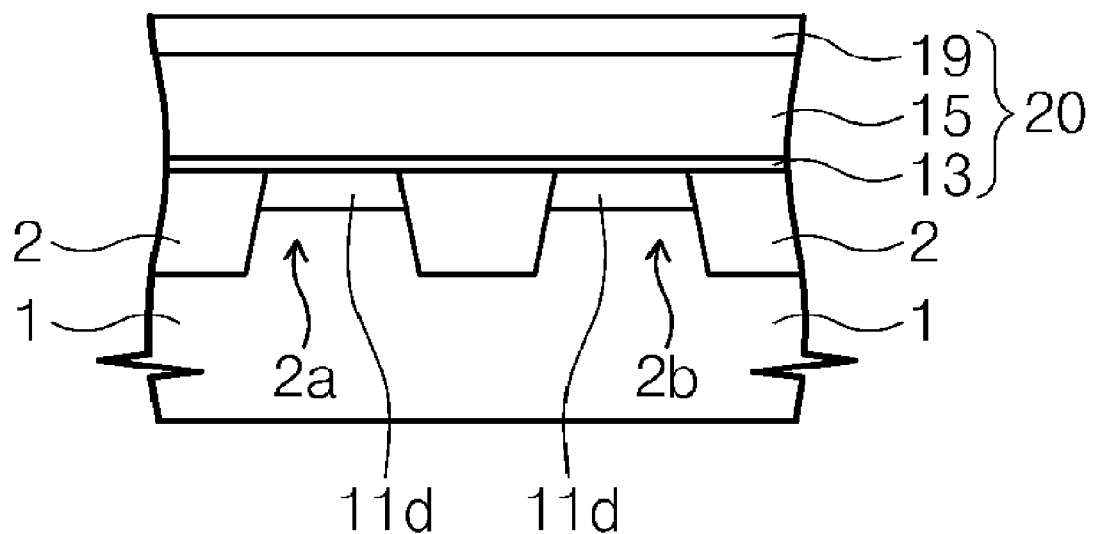

As shown in FIGS. 10, 12a, and 12b, a first lower insulation layer 15 may be formed on the lower etching stop layer 13. The first lower insulation layer 15 may be formed of a silicon oxide layer. A common source line 17s, first node pads 17a, and second node pads 17b may be formed in the first lower insulation layer 15. The common source line 17s may be electrically connected to the first and second string source regions 11s. The first node pads 17a may be electrically connected the first lower node region 11a of the first lower active region 2a and the first lower node region 11a of the second lower active region 2b. The second node pads 17b may be electrically connected to the second lower node region 11b of the first lower active region 2a and the second lower node region 11b of the second lower active region 2b.

A second lower insulation layer 19 may be formed on the first lower insulation layer 15, the common source line 17s, and the node pads 17a and 17b. The second lower insulation layer 19 may be formed of a silicon oxide layer. The lower etching stop layer 13, the first lower insulation layer 15, and the second lower insulation layer 19 may constitute a lower insulation layer 20. However, example embodiments are not intended to be so limited. For example, in some exemplary embodiments, a process for forming the lower etching stop layer 13 may be omitted.

As shown in FIG. 13, a buffer layer 103 may be formed on a surface (e.g., a main surface) of a handling substrate 101. The handling substrate 101 may be a semiconductor substrate. For example, the handling substrate 101 may be a silicon substrate or the like. The buffer layer 103 may be an insulating buffer layer. For example, the buffer layer 103 may be formed of an insulation layer such as a silicon oxide layer.

Then, by implanting impurity ions 105 such as hydrogen ions into the upper portion of the handling substrate 101 below the buffer layer 103, an impurity ion layer 107 (e.g., a hydrogen ion layer) may be formed in the handling substrate 101.

The buffer layer 103 may reduce or prevent ion implantation damage on a main surface of the handling substrate 101 while the impurity ions 105 are implanted. The impurity ion layer 107 may be formed with a predetermined depth from the main surface of the handling substrate 101. In some exemplary embodiments of example embodiments, a process for forming the buffer layer 103 may be omitted.

As shown in FIG. 14, a thermal treatment process may be performed on the handling substrate 101 having the impurity ion layer 105 to activate impurity ions (e.g., hydrogen ions) in the impurity ion layer 107. As a result, minute bubbles may be formed in the impurity ion layer 107 and a surface layer 101a between the main surface of the handling substrate 101 and the impurity ion layer 107 may be detached from a bulk layer 101b of the handling substrate 101 as illustrated in FIG. 14. The surface layer 101a and the buffer layer 103 may constitute the second substrate 104, e.g., an upper substrate. The surface layer 101a may be a semiconductor layer such as a silicon layer or the like. As described herein, when a process for forming the buffer layer 103 is omitted, the upper substrate 104 may include only the semiconductor layer 101a. Additional substrates may be added.

Since the semiconductor layer 101a may be detached because of the activation of the impurity ions, a detached surface of the semiconductor layer 101a may be uneven as illustrated in FIG. 14. Accordingly, a polishing process may be applied on the detached surface of the semiconductor layer 101a. Preferably, the semiconductor layer 101a has a smooth surface.

Figure 15A:
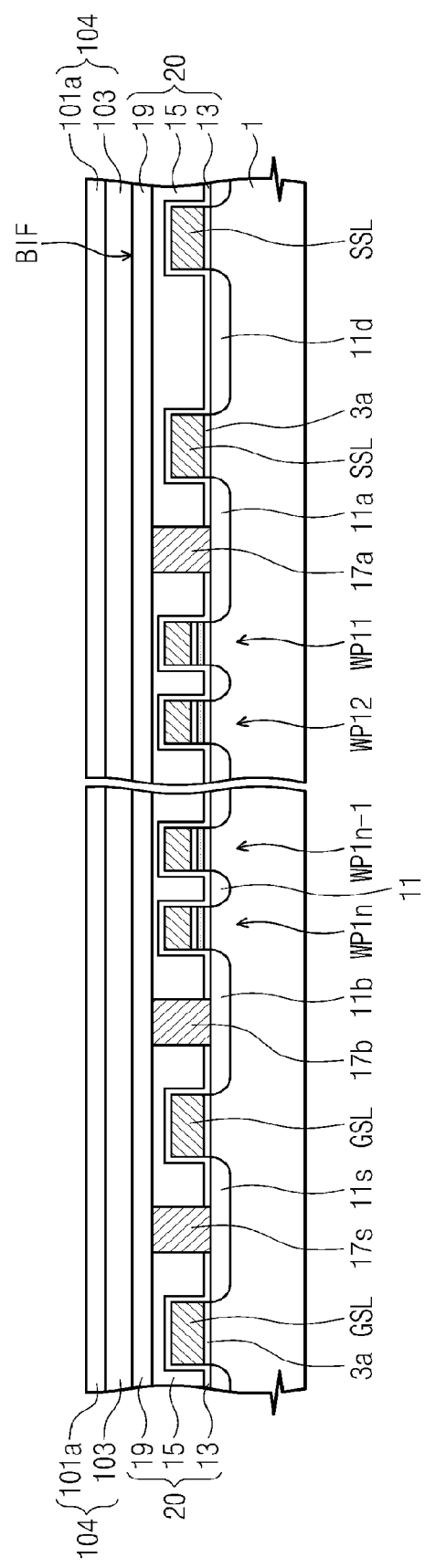
Figure 15B:
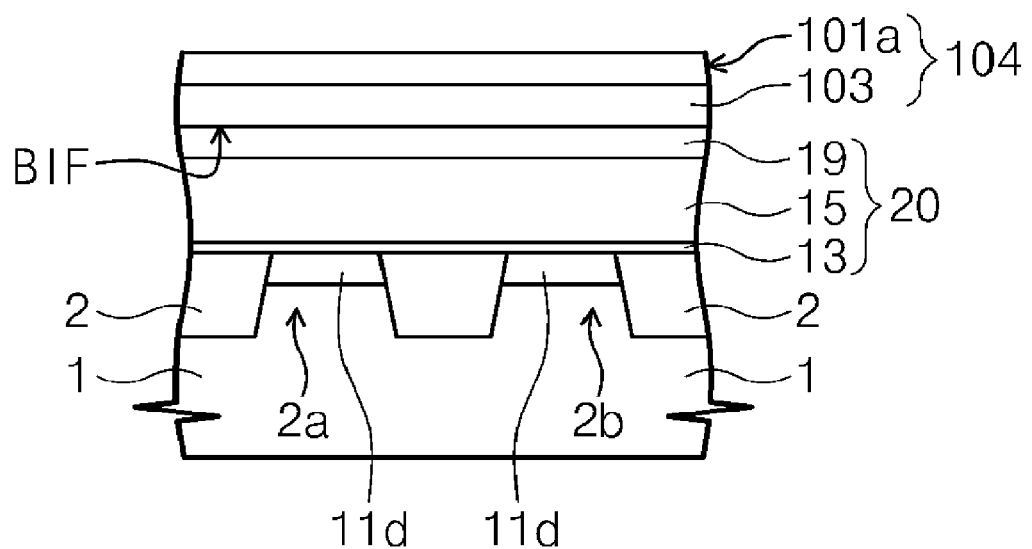

As shown in FIGS. 15a and 15b, the upper substrate 104 may be physically bonded onto the lower insulation layer 20. When the upper substrate 104 includes the semiconductor layer 101a and the buffer layer 103, the lower insulation layer 20 may be bonded to the buffer layer 103. As described herein, since the upper substrate 104 is physically bonded onto the lower insulation layer 20, adhesion between the upper substrate 104 and the lower insulation layer 20 may become weak. For example, since BIF between the upper substrate 104 and the lower insulation layer 20 may have weak adhesion, when the BIF is exposed to external stress or a chemical solution, the upper substrate 104 may be detached from the lower insulation layer 20.

In another exemplary embodiment, a polishing process may be applied to the semiconductor layer 101a after the upper substrate 104 is bonded onto the lower insulation layer 20.

Figure 16A:
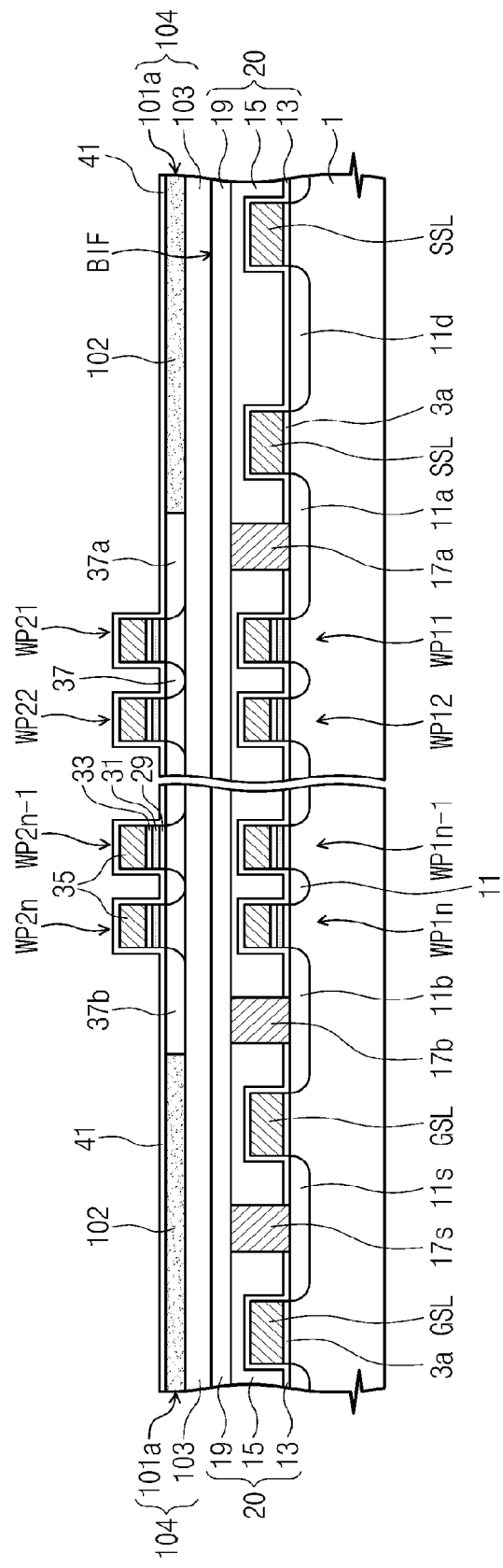
Figure 16B:
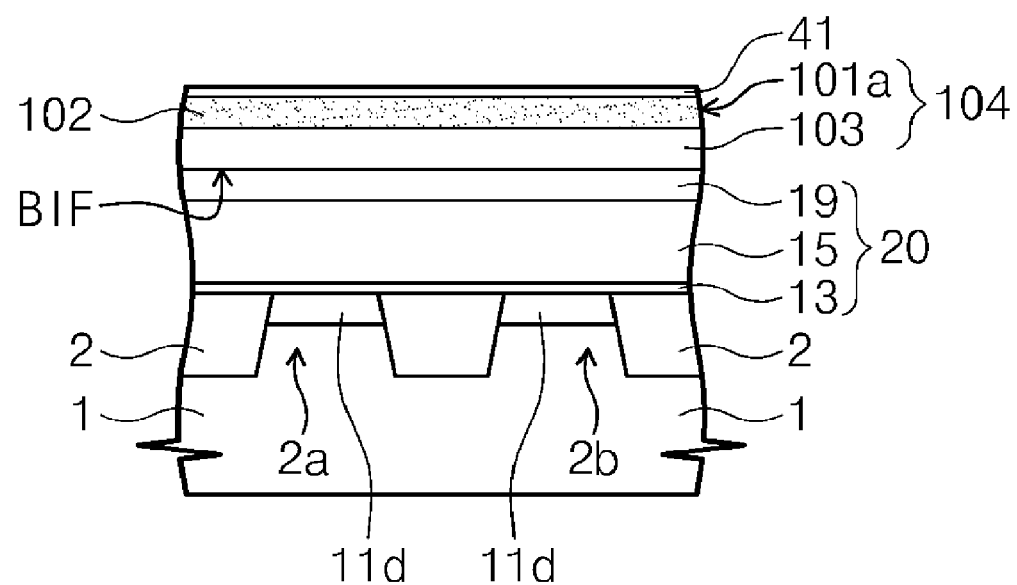

As shown in FIGS. 10, 16A, and 16B, an upper device isolation layer 102 may be formed on a predetermined region of the semiconductor layer 101a to define first and second upper active regions. The first and second upper active regions may be formed on the first and second lower active regions 2a and 2b. A plurality of upper word line patterns WP21 to WP2n is formed to cross over the upper active regions. Each of the upper word line patterns WP21 to WP2n may include a tunnel insulation layer 29, a charge storage layer 31, a blocking insulation layer 33, and a control gate electrode 35 (e.g., sequentially stacked). The control gate electrode 35 of the first upper word line pattern WP21 may correspond to the first upper word line WL21 of FIG. 9. Likewise, the control gate electrode 35 of the $n^{th}$ upper word line pattern WP2n may correspond to the $n^{th}$ upper word line WL2n of FIG. 9. The first to $n^{th}$ upper word line patterns WP21 to WP2n preferably overlap the first to $n^{th}$ upper word line patterns WP11 to WP1n, respectively.

In other exemplary embodiments, the charge storage layer 31 may be formed of a conductive layer or an insulation layer. When the charge storage layer 31 is formed of the conductive layer, the charge storage layer 31 may function as a floating gate. When the charge storage layer 31 is formed of the insulation layer, the charge storage layer 31 may function as a charge trap layer.

By using the upper word line patterns WP21 to WP2n as ion implantation masks, second conductivity type impurity ions, e.g., N-type impurity ions, may be implanted into the upper active regions to form upper impurity regions. The upper impurity regions may include a first upper node region 37a, a second upper node region 37b, and a plurality of upper cell source/drain regions 37. The first upper node region 37a may be formed in the upper active regions adjacent to the first upper word line pattern WP21 and opposite to the second upper word line pattern WP22, and the second upper node region 37b may be formed in the upper active regions adjacent to the $n^{th}$ upper word line pattern WP2n and opposite to the n-1$^{th}$ upper word line pattern WP2n-1. Additionally, the plurality of upper cell source/drain regions 37 may be formed in the upper active regions between the upper word line patterns WP21 to WP2n.

The first to $n^{th}$ upper cell transistors UCT1 to UCTn of FIG. 9 may be formed respectively on intersections of the upper word line patterns WP21 to WP2n and the first upper active region. Likewise, the first to $n^{th}$ upper cell transistors LCT1 to LCTn of FIG. 9 may be formed on intersections of the upper word line patterns WP21 to WP2n and the second upper active region.

The upper cell transistors UCT1 to UCTn in the first upper active region may be connected in series to form a first upper memory cell unit USTR1, e.g., a first upper NAND string. Similarly, the upper cell transistors UCT1 to UCTn in the second upper active region may be connected in series to form a second upper memory cell unit USTR2, e.g., a second upper NAND string.

An upper etching stop layer 41 may be formed on at least a surface of the substrate having the first and second upper memory cell units USTR1 and USTR2. The upper etching stop layer 41 may be formed of a layer (e.g., an insulation layer) having an etch selectivity with respect to a silicon oxide layer. For example, the upper etching stop layer 41 may be formed of a silicon nitride layer. In exemplary embodiments, a process to form the upper etching strop layer 41 may be omitted.

Figure 17A:
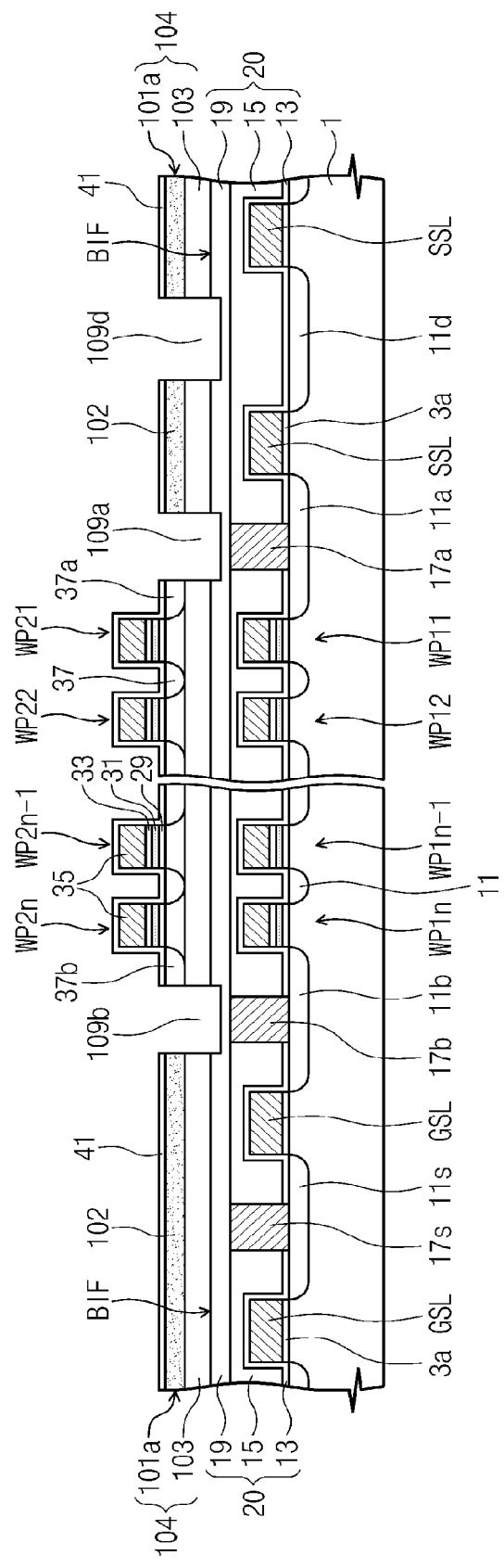
Figure 17B:
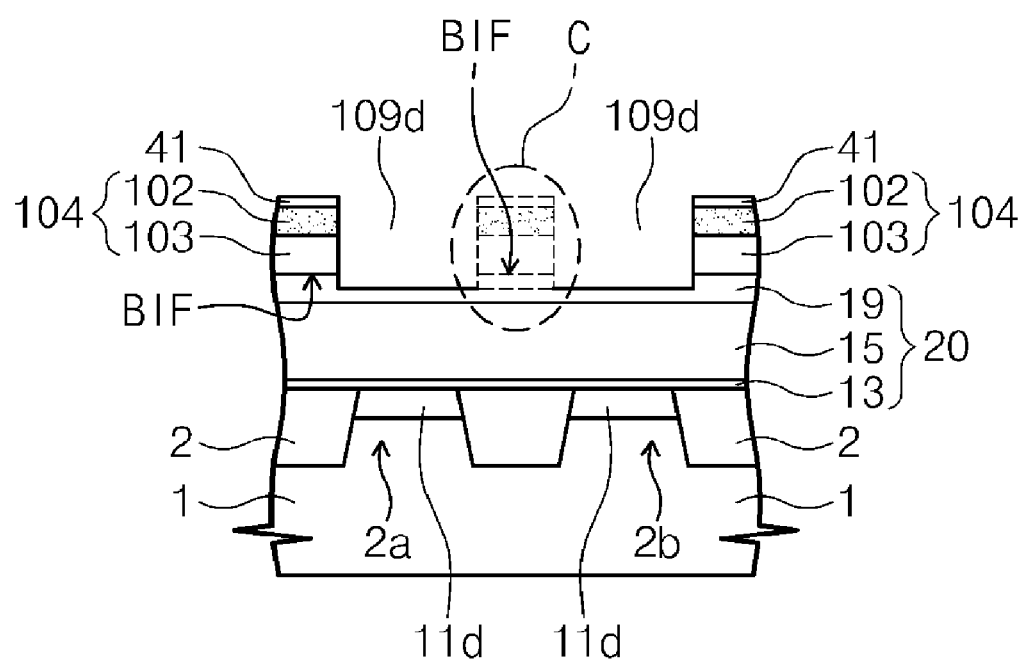

As shown in FIGS. 10, 17A, and 17B, the upper etching stop layer 41, the upper substrate 104, and the lower insulation layer 20 may include recesses or grooves. For example, the upper etching stop layer 41, the upper substrate 104, and the lower insulation layer 20 may be etched to form grooves. The grooves may include bit line grooves 109d, first node grooves 109a, and second node grooves 109b. The bit line grooves 109d may be formed on the string drain regions 11d, respectively. The first node grooves 109a may be formed on the first lower node regions 11a, respectively. The second node grooves 109b may be formed on the second lower regions 11b, respectively. For example, the first node grooves 109a may be formed adjacent to the first upper node regions 37a and the second node grooves 109b may be formed adjacent to the second upper node regions 37b. However, example embodiments are not intended to be so limited. For example, the first node groove 109a may be formed to expose the first upper node region 37a, and the second node groove 109b may be formed to expose the second upper node region 37b.

The grooves 109d, 109a, and 109b may penetrate the upper substrate 104 to extend into the lower insulation layer 20. Accordingly, each of the grooves 109d, 109a, and 109b may be formed to have a lower bottom surface than the BIF, which may expose the BIF. For example, the grooves 109d, 109a, and 109b may have a sidewall that exposes the BIF.

The bit line grooves 109d may be formed to be spaced apart from each other as illustrated in FIG. 17B. In this case, a portion C of FIG. 10 and FIG. 17B of the upper substrate 104 may remain between the bit line grooves 109d. Alternatively, at least two adjacent bit line grooves 109d among the bit line grooves 109d may be connected to each other in order to form a single unified bit line groove. In this case, the portion C of the upper substrate 104 between the two adjacent bit line grooves 109d may be removed, for example, during an etching process for forming the grooves 109d, 109a, and 109b.

Figure 18A:
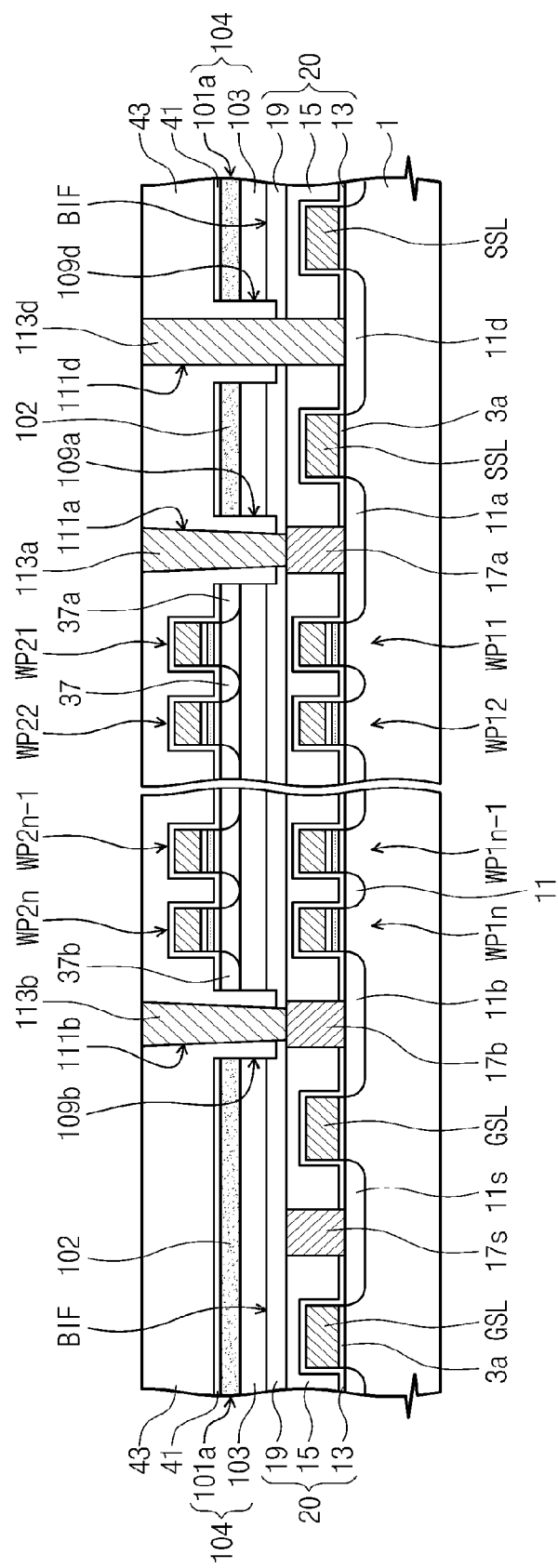
Figure 18B:
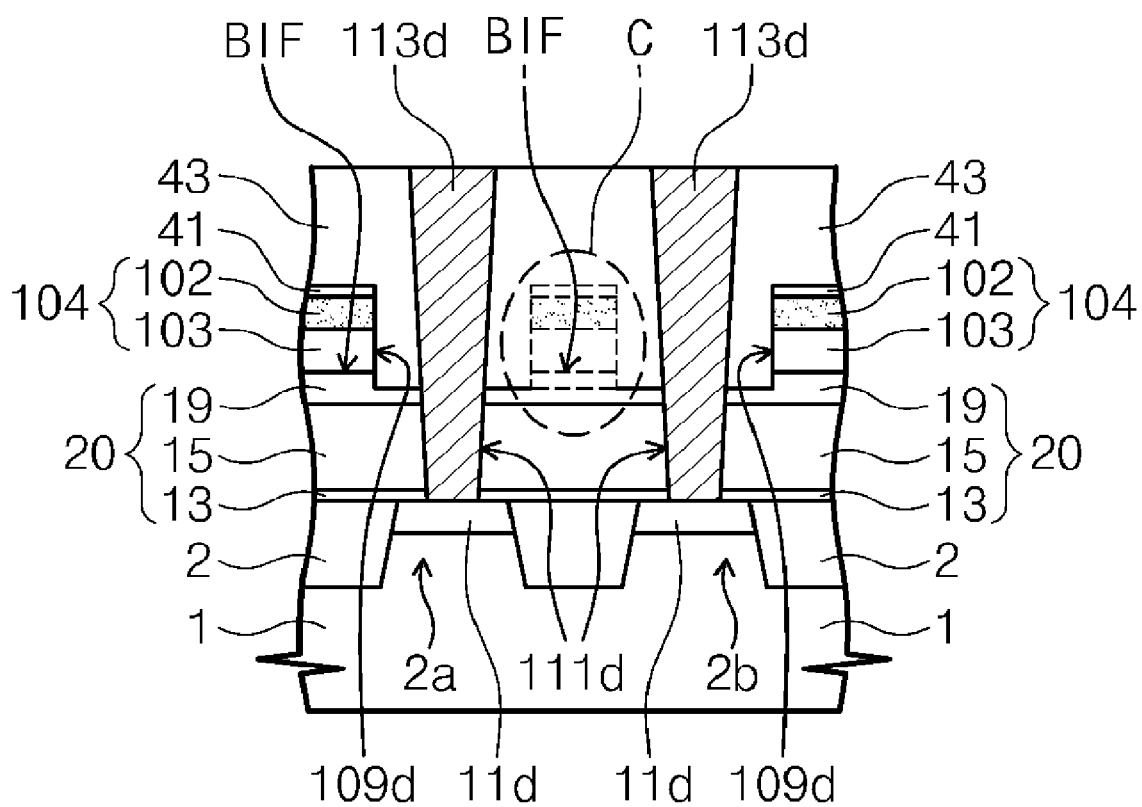

As shown in FIGS. 10, 18a, and 18b, a first upper insulation layer 43 may be formed on the upper etching stop layer 41 to fill the grooves 109d, 109a, and 109b. The first upper insulation layer 43 may be formed of a silicon oxide layer. By removing or etching the first upper insulation layer 43 and the lower insulation layer 20, bit line contact holes 111d to expose the string drain regions 11d, first node contact holes 111a to expose the first node pads 17a, second node contact holes 111b to expose the second node pads 17b may be formed. The bit line contact holes 111d may penetrate the first upper insulation layer 43 in the bit line grooves 109d and be spaced apart from the BIF. Likewise, the first node contact holes 111a may penetrate the first upper insulation layer 43 in the first node grooves 109a and be spaced apart from the BIF, and the second node contact holes 111b may penetrate the first upper insulation layer 43 in the second node grooves 109b and be spaced apart from the BIF. For example, the bit line contact holes 111d, the first node contact holes 111a, and the second node contact holes 111b as described herein preferably do not expose any portion of the BIF. According to exemplary embodiments of the example embodiments, after the forming of the contact holes 111d, 111a, and 111b, when a wet process such as a cleansing process is applied to the substrate having the contact holes 111d, 111a, and 111b, the upper substrate 104 is prevented from being detached from the lower insulation layer 20 along the BIF. For example, reduced or no contact with the BIF is reduced or eliminated during a cleaning process and spaces formed along the BIF are reduced or eliminated.Preferably, an insulation layer (e.g., the first upper insulation layer 43) is provided to at least temporarily cover the exposed BIF. The first upper insulation layer 43 may be subsequently removed.

Bit line contact plugs 113d may be formed in the bit line contact holes 111d, and first and second node plugs 113a and 113b may be formed in the first and second node contact holes 111a and 111b, respectively. For example, a conductive layer may be formed on the first upper insulation layer 43 to fill the contact holes 111d, 111a, and 111b. The conductive layer may be planarized to expose the surface of the first upper insulation layer 43.

When the contact holes 111d, 111a or 111b expose the BIF, a wet process such as a cleansing process applied to the substrate having the contact holes 111d, 111a, and 111b, may generate a minute space along the BIF between the contact holes 111d, 111a and 111b. In this case, while a conductive layer is formed to fill the contact holes 111d, 111a, and 111b, the minute space may be filled with the conductive layer. Accordingly, conductive bridges may be formed between the plugs 113a, 113b, and 113d, especially, between the bit line contact plugs 113d. However, according to example embodiments, conductive bridges may be reduced or prevented between the plugs 113a, 113b, and 113d (e.g., between the bit line contact plugs 113d) at least because the bit line contact holes 111 do not expose any portion of the BIF.

Figure 19A:
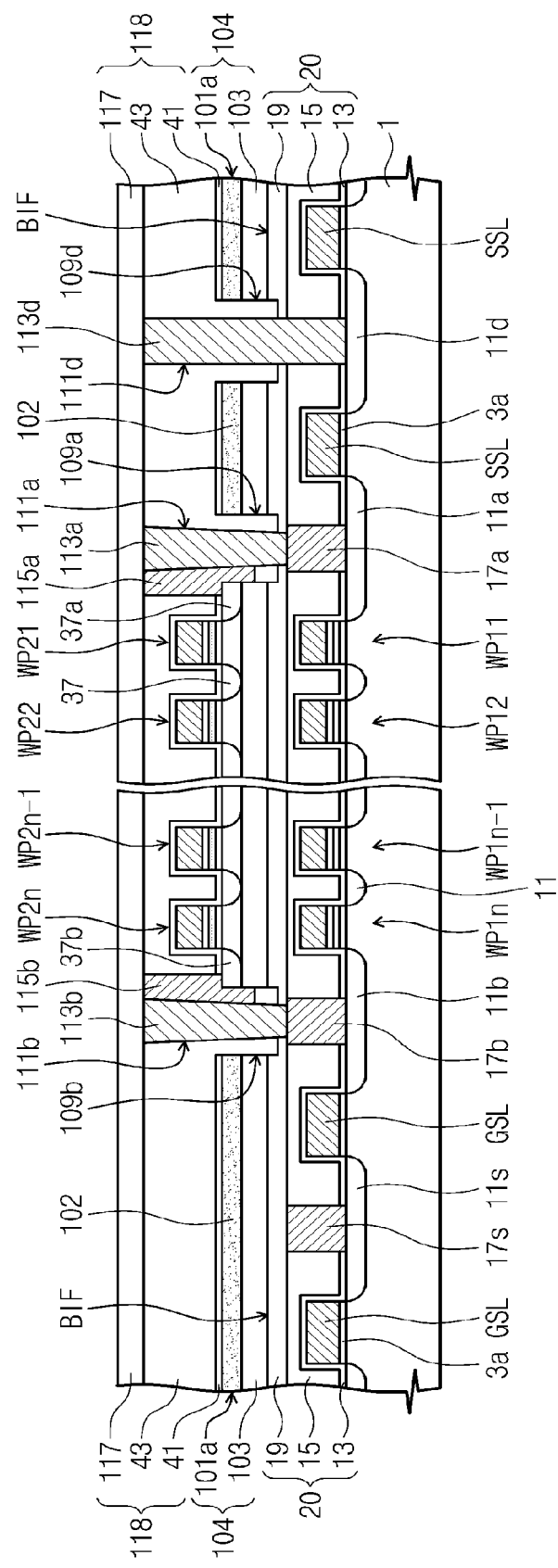
Figure 19B:
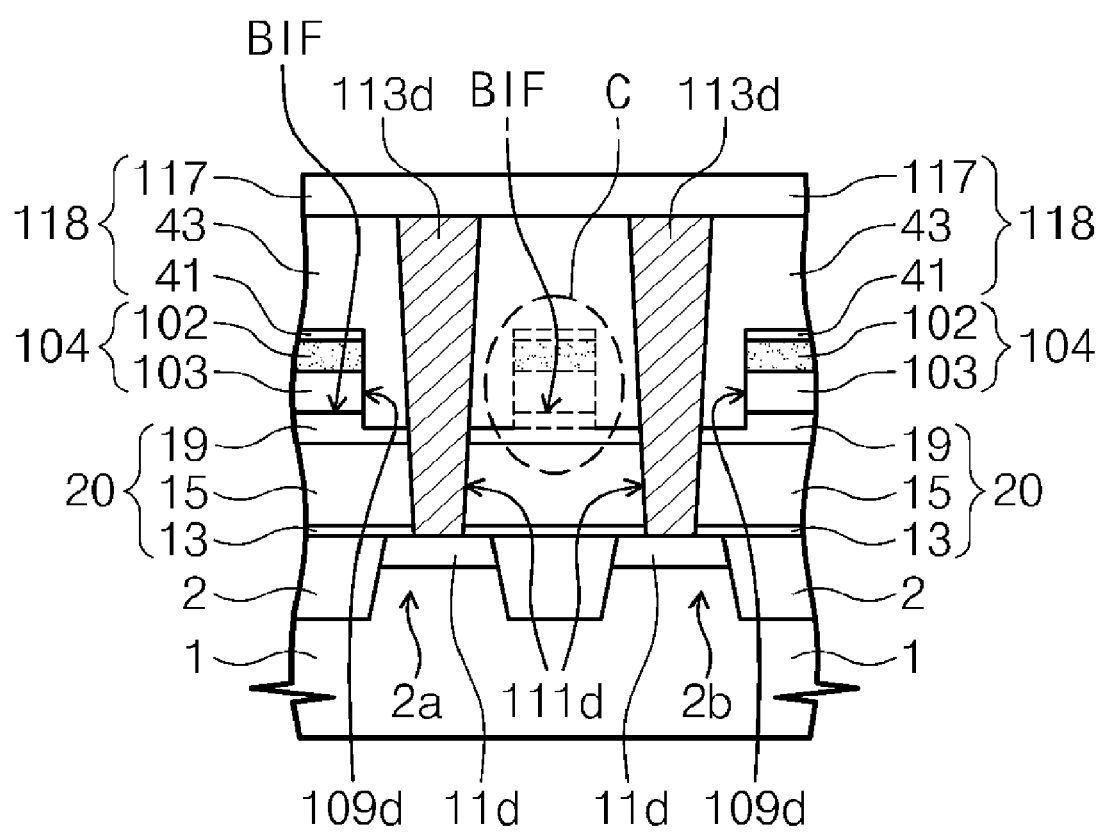

As shown in FIGS. 10, 19A, and 19B, the first upper insulation layer 43 and the lower etching stop layer 41 may be patterned to form first and second connector holes. The first connector holes may be formed to expose the first upper node regions 37a and the adjacent first node plugs 113a. The second connector holes may be formed to expose the second upper node regions 37b and the adjacent second node plugs 113b. The first and second connector holes may be formed to have a higher bottom surface than the BIF. As a result, the BIF may not be exposed by the first and second connector holes.

First and second connectors 115a and 115b may be formed in the first and second connector holes, respectively. For example, a conductive layer, e.g., a metal layer, may be formed on the first upper insulation layer 43 to fill the first and second connector holes, and the conductive layer may be planarized to expose the surface of the first upper insulation layer 43.

Each of the first connectors 115a may connect (e.g., electrically, physically) one of the first upper node regions 37a with the nearby first node plug 113a, and each of the second connectors 115b may connect (e.g., electrically) one of the second upper node regions 37b with the corresponding second node plug 113b. Accordingly, the first upper node regions 37a may be electrically connected to the first lower node regions 111a, respectively, through the first connectors 115a and the first node plugs 113a. The second upper node regions 37b may be electrically connected to the second lower node regions 111b, respectively, through the second connectors 115b and the second node plugs 113b.

A second upper insulation layer 117 may be formed on the connectors 115a and 115b, the node plugs 111a and 111b, the bit line contact plugs 113d, and the first upper insulation layer 43. The second upper insulation layer 117 may be formed of a silicon oxide layer. The upper etching stop layer 41, the first upper insulation layer 43, the second upper insulation layer 117 may constitute an upper insulation layer 118.

Figure 20B:
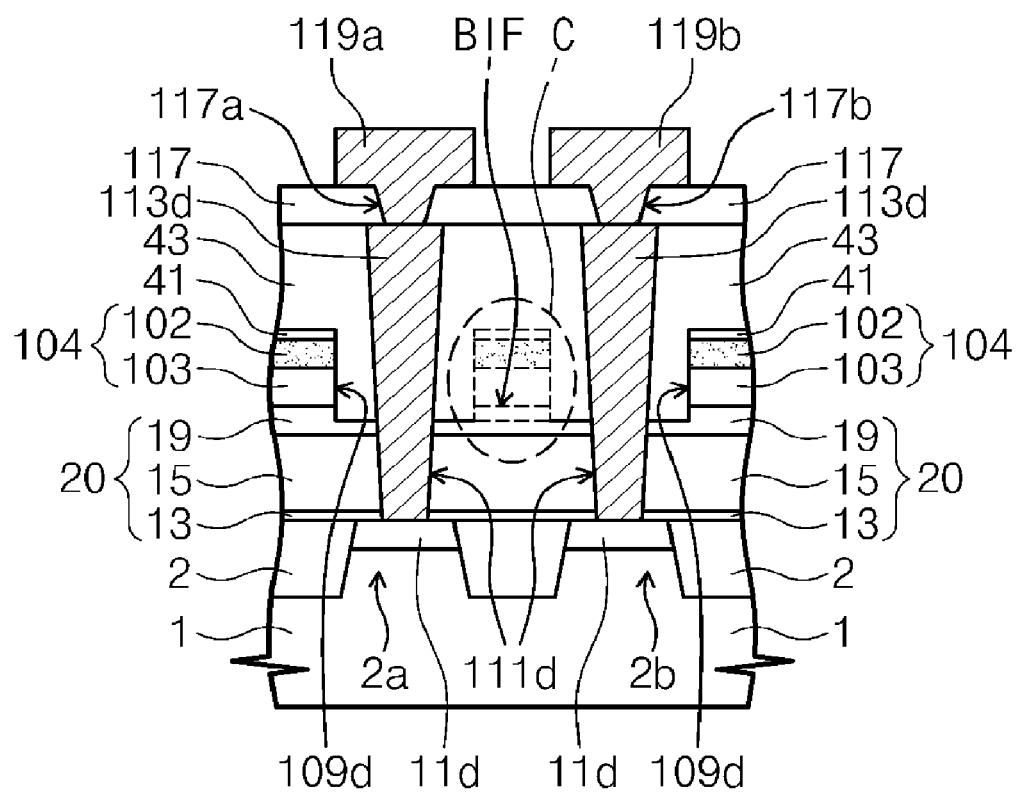

As shown in FIGS. 10, 20A, and 20B, the second upper insulation layer 117 may patterned to form a first contact hole 117a in order to expose the bit line contact plug 113d on the first lower active region 2a and to form a second contact hole 117b in order to expose the bit line contact plug 113d on the second lower active region 2b. A conductive layer may be formed on the second upper insulation layer 117 to fill the contact holes 117a and 117b and then, the conductive layer may be patterned to form first and second bit lines 119a and 119b crossing over the word line patterns WP11 to WP1n and WP21 to WP2n. The first bit line 119a is electrically connected to the bit line contact plug 113d on the first lower active region 2a through the first contact hole 117a, and the second bit line 119b is electrically connected to the bit line contact plug 113d on the second lower active region 2b through the second contact hole.

In other example embodiments, the bit line contact holes 111d may be formed after the forming of the second upper insulation layer 117. In such embodiments, the bit line contact plugs 113d may be formed to completely penetrate the lower insulation layer 20 and the upper insulation layer 118, and a process for forming the first and second contact holes 117a and 117b may be omitted.

Although various exemplary grooves have been shown having a rectangular cross-section, example embodiments are not intended to be so limited. For example, grooves according to example embodiments may include linear or nonlinear (e.g., parabolic) sidewalls or bottom surfaces or various shaped cross-sections (e.g., triangular, stepped). Further, such grooves may include recesses, trenches, holes (e.g., circular, square), donut-shapes or the like. In addition, although three-dimensional devices have been illustrated with a single (e.g., flat) interface therebetween, example embodiments may include additional substrates (e.g., interfaces) and/or a multi-level interface and/or non-horizontal interfaces therebetween.

As described herein, according to example embodiments, the BIF between the lower insulation layer 20 and the upper substrate 104 is not exposed by the contact holes 111d, 111a, and 111b. According to example embodiments, even when a wet process is applied to the contact holes 111d, 111a, and 111b, no space is formed along the BIF between the contact holes 111d, 111a, and 111b. According to example embodiments, an electrical short between the plugs 113d, 113a, and 113b may not occur in the contact holes 111d, 111a, and 111b even when a distance between the contact holes is reduced, and malfunctions of integrated circuits may be reduced.

According to example embodiments, the BIF between the lower insulation layer and the upper substrate may be separated from the contact plug. When the contact plug is formed, a conductive material of the contact plug penetrating into the BIF may be reduced or prevented. According to example embodiments, contact plugs are prevented from being electrically connected to another contact plug (e.g., an adjacent contact plug).

Any reference in this specification to "one embodiment," "an embodiment," "example embodiment," some embodiments, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the present general inventive concept. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transition terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method of fabricating a semiconductor device, the method comprising:
   forming a lower insulation layer on a lower substrate;
   disposing an upper substrate on the lower insulation layer so that a bottom surface of the upper substrate contacts the lower insulation layer;
   forming a groove penetrating the upper substrate and into the lower insulation layer, the groove having a bottom surface that is lower than an interface between the upper substrate and the lower insulation layer and is higher than a bottom surface of the lower insulation layer;
   forming a contact device in at least a portion of the groove extending over the lower insulation layer;
   forming an upper insulation layer to cover the interface exposed in the groove, and to cover a top surface of the upper substrate opposite to the bottom surface of the upper substrate,
   wherein the top surface of the upper substrate directly contacts the upper insulation layer;
   forming a lower memory cell unit at the lower substrate;
   forming an upper memory cell unit at the upper substrate;
   wherein the upper insulation layer is disposed on the upper substrate and the upper memory cell unit to fill a bit line groove,
   wherein the lower memory cell unit is a lower NAND flash memory cell unit including a lower NAND string, and
   wherein the upper memory cell unit is an upper NAND flash memory cell unit including an upper NAND string;
   forming a first node groove and a second node groove, the first node groove penetrating the upper substrate between a bit line contact plug and the uppper NAND string to extend into the lower insulation layer, the second node groove penetrating the upper substrate adjacent to the upper NAND string and the opposite to the first node groove to extend into the lower insulation layer, the first and second node grooves each having a bottom surface lower than the interface;
   forming a first node plug and a second node plug, the first node plug penetrating the upper insulation layer in the first node groove to extend into the lower insulation layer and to be electrically connected to the lower substrate adjacent to a selection transistor and opposite to the bit line contact plug, the second node plug penetrating the upper insulation layer in the second node groove to extend into the lower insulation layer and to be electrically connected to the lower substrate between a ground selection transistor and the lower NAND string; and
   forming a first connector and a second connector, the first connector penetrating the upper insulation layer to electrically connect the upper substrate between the first node plug and the upper NAND string with the first node plug, the second
   connector penetrating the upper insulation layer to electrically connect the upper substrate between the second node plug and the upper NAND sting with the second node plug, wherein the first and second node grooves and the bit line groove are simultaneously formed.

2. The method of claim 1, wherein disposing the upper substrate on the lower insulation layer comprises:
providing the upper substrate; and
physically bonding the upper substrate onto the lower insulation layer.

3. The method of claim 1,
wherein the groove is formed to have a sidewall comprising the exposed interface,
wherein the upper insulation layer is disposed to cover the bottom surface of the groove, and
wherein the contact device penetrates the upper insulation layer physically spaced apart from the interface.

4. The method of claim 1,
wherein the upper substrate comprises a semiconductor layer with an insulating buffer layer or without the insulating buffer layer; and
wherein the lower insulation layer covers the entire lower substrate and is bonded onto the semiconductor layer or the insulating buffer layer.

5. The method of claim 1, wherein forming the contact device comprises forming a contact plug to electrically contact the lower substrate by direct physical contact with the lower substrate or by forming a first intermediate component to provide the electrical contact with the lower substrate, and
wherein the first intermediate component comprises a gate electrode or a contact pad between the lower substrate and the contact plug.

6. A method of fabricating a semiconductor device, the method comprising:
forming a lower insulation layer on a lower substrate;
disposing an upper substrate on the lower insulation layer;
forming a groove penetrating the upper substrate and into the lower insulation layer, the groove having a bottom surface that is lower than an interface between the upper substrate and the lower insulation layer;
forming a contact device in a portion of the groove extending over the lower insulation layer;
forming an upper insulation layer to cover the interface exposed in the groove;
forming a lower NAND string at the lower substrate;
forming an upper NAND string at the upper substrate;
forming a first node groove and a second node groove, the first node groove penetrating the upper substrate between a bit line contact plug and the upper NAND string to extend into the lower insulation layer, the second node groove penetrating the upper substrate adjacent to the upper NAND string and opposite to the first node groove to extend into the lower insulation layer, the first and second node grooves each having a bottom surface lower than the interface;
forming a first node plug and a second node plug, the first node plug penetrating the upper insulation layer in the first node groove to extend into the lower insulation layer and to be electrically connected to the lower substrate adjacent to a selection transistor and opposite to the bit line contact plug, the second node plug penetrating the upper insulation layer in the second node groove to extend into the lower insulation layer and to be electrically connected to the lower substrate between a ground selection transistor and the lower NAND string; and
forming a first connector and a second connector, the first connector penetrating the upper insulation layer to electrically connect the upper substrate between the first node plug and the upper NAND string with the first node plug, the second connector penetrating the upper insulation layer to electrically connect the upper substrate between the second node plug and the upper NAND sting with the second node plug,
wherein the upper insulation layer is disposed on the upper substrate and the upper memory cell unit to fill a bit line groove, and
wherein the first and second node grooves and the bit line groove are simultaneously formed.

7. The method of claim 6, wherein disposing the upper substrate on the lower insulation layer comprises:
providing the upper substrate; and
physically bonding the upper substrate onto the lower insulation layer.

8. The method of claim 6, wherein the upper insulation layer is disposed to cover the bottom surface of the groove, and
wherein the contact device penetrates the upper insulation layer physically spaced apart from the interface.

9. The method of claim 6, wherein the upper substrate comprises a semiconductor layer with an insulating buffer layer or without the insulating buffer layer; and
wherein the lower insulation layer covers the entire lower substrate and is bonded onto the semiconductor layer or the insulating buffer layer.

* * * * *